(12) United States Patent
Liu

(10) Patent No.: US 7,408,198 B2
(45) Date of Patent: Aug. 5, 2008

(54) THIN FILM TRANSISTOR, THIN FILM TRANSISTOR ARRAY AND REPAIRING METHOD THEREOF

(75) Inventor: Wen-Hsiung Liu, Pingtung County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 64 days.

(21) Appl. No.: 11/307,540

(22) Filed: Feb. 13, 2006

(65) Prior Publication Data
US 2007/0187686 A1    Aug. 16, 2007

(51) Int. Cl.
*H01L 29/15*    (2006.01)
*H01L 29/04*    (2006.01)

(52) U.S. Cl. .................. 257/72; 257/E29.294; 257/59; 257/E29.291

(58) Field of Classification Search .................. 257/72, 257/E29.294
See application file for complete search history.

(56) References Cited

U.S. PATENT DOCUMENTS 5,877,512 A    3/1999  Kim ............................. 257/57

6,825,907 B2    11/2004  Hashiguchi et al. ......... 349/139
2003/0081165 A1    5/2003  Chu et al. .................... 349/149
2006/0290630 A1 *  12/2006  Kim et al. ..................... 345/92

FOREIGN PATENT DOCUMENTS

JP    2001-296553    10/2001

* cited by examiner

Primary Examiner—Tu-Tu Ho
(74) Attorney, Agent, or Firm—Jianq Chyun IP Office

(57) ABSTRACT

A thin film transistor (TFT) including a gate, a semiconductor layer, a source and a drain is provided. The gate has a control part, a connection part and a capacitance compensation part. The connection part is disposed between the control part and the capacitance compensation part for joining the two parts together. The semiconductor layer is disposed over the gate, the source and the drain are disposed on the semiconductor layer. An end of the drain overlaps the control part of the gate with a first region for composing a first parasitic capacitance; while another end of the drain overlaps the capacitance compensation part of the gate with a second region for composing a second parasitic capacitance. In a TFT array with the TFT, the sum of the first parasitic capacitance and the second parasitic capacitance is a constant.

17 Claims, 6 Drawing Sheets

THIN FILM TRANSISTOR, THIN FILM TRANSISTOR ARRAY AND REPAIRING METHOD THEREOF

BACKGROUND OF THE INVENTION

1. Field of Invention

The present invention relates to a thin film transistor (TFT), and particularly to a thin film transistor (TFT), a thin film transistor array (TFT array) and a repairing method thereof capable of enhancing even brightness of a LCD panel.

2. Description of the Related Art

The rapid development in the multimedia industry is largely attributed to the progress in the semiconductor devices or display apparatuses. In terms of displays, the TFT liquid crystal displays (TFT-LCDs), with such advantages as high display quality, high space utilization, low power consumption and no radiation, have played a major role in the mainstream display market.

A TFT-LCD mainly includes a TFT array, a color filter and a liquid crystal layer. FIG. 1 is a top view of a conventional thin film transistor array (TFT array). Referring to FIG. 1, a TFT array 100 mainly includes a plurality of pixel structures 110 arranged to form an array. Wherein, each pixel structure 110 includes a scan line 112, a data line 114, a TFT 116 and a pixel electrode 116 corresponding to the TFT 116.

The TFT 116 is used as a switch device of the pixel structure 110, the scan line 112 and the data line 114 are used to provide the corresponding pixel structure 110 with appropriate operation voltage for driving the corresponding pixel structure 110 to display an image.

FIG. 2 is a schematic equivalent circuit drawing of a single pixel in a conventional TFT LCD. Referring to FIG. 2, in a single pixel, normally a TFT 116, a liquid crystal capacitor $C_{LC}$ and a storage capacitor $C_{st}$ are included.

Referring to FIGS. 1 and 2, the liquid crystal capacitor $C_{LC}$ is formed by coupling the pixel electrode 118 on the TFT array 100 and a common electrode on the color filter (not shown). The storage capacitor $C_{st}$ disposed on the TFT array 100 is connected to the liquid crystal capacitor $C_{LC}$ in parallel. In addition, the gate G, the source S and the drain D of the TFT 116 are coupled to the scan line 112, the data line 114 and the pixel electrode 118 forming the liquid crystal capacitor $C_{LC}$, respectively. Since the gate G and the drain D of the TFT 116 are partially overlapped, the overlapping region produces a gate-drain parasitic capacitor $C_{gd}$.

Referring FIGS. 1 and 2 again, note that between the voltage applied on the liquid crystal capacitor $C_{LC}$, i.e. the voltage applied on the pixel electrode 118 and the common electrode, and the optical transmittance of liquid crystal molecules, there is a specific relationship. Therefore, once the voltage applied on the liquid crystal capacitor $C_{LC}$ is controlled according to predetermined displayed frame, the desired frames are able to be produced. Wherein, as the TFT 116 is off, the voltage applied on the liquid crystal capacitor $C_{LC}$ theoretically keeps unchanged, i.e. in a holding state. However, due to the presence of the gate-drain parasitic capacitor $C_{gd}$, the voltage kept by the liquid crystal capacitor $C_{LC}$ varies slightly with the changed signals on the data line 114, called a coupling effect. Therefore, the voltage kept by the liquid crystal capacitor $C_{LC}$ is eventually apart from the preset value. Such a voltage variation is called feed-through voltage $\Delta V_p$ and is expressed as follows:

$$\Delta V_p = (C_{gd}/(C_{gd}+C_{st}+C_{LC})) \cdot \Delta V_g \quad (1)$$

Wherein $\Delta V_g$ indicates an amplitude of a pulse voltage applied on the scan line 112.

Among current exposure processes for fabricating the thin film transistor array disposed on a substrate, mostly use a stepper to form shots in the panel. In other words, the TFT array's pattern is composed of the shots formed by the stepper. Wherein, a displacement error during movements of the stepper would cause nonconformity among the pattern positions in each shot region. In particular, if the overlapping areas between the gate G and the drain A of the TFT 116 corresponding to each shot region are different, the resulted gate-drain parasitic capacitances $C_{gd}$ corresponding to each shot region are also different, which makes inconsistent feed-through voltage $\Delta V_p$ in each shot region and produces uneven on the display.

SUMMARY OF THE INVENTION

An object of the present invention is to provide a thin film transistor (TFT) may be used in TFT arrays to avoid nonconformity of gate-drain parasitic capacitances in each TFT caused by the exposure process error during a TFT array process.

Another object of the present invention is to provide a thin film transistor array (TFT array) to avoid the nonconformity of feed-through voltages in each pixel caused by the exposure process error during a TFT array process.

A further object of the present invention is to provide a method for repairing thin film transistor arrays (TFT arrays) to reduce the bright spots on the display.

To reach the above-described objects or the others, the present invention provides a TFT includes a gate, a semiconductor layer, a source and a drain. Wherein, the gate disposed on a substrate has a control part, a connection part and a capacitance compensation part, and the connection part is used for joining the control part and the capacitance compensation part. The semiconductor layer is disposed over the gate, while the source and the drain are partially disposed on the semiconductor layer and a channel is formed in the part of the semiconductor layer between the source and the drain. Besides, between an end of the drain and the control part of the gate, a first overlapping region is formed, which induces a first parasitic capacitance, while between another end of the drain and the capacitance compensation part of the gate, a second overlapping region is formed, which induces a second parasitic capacitance, wherein the sum of the first parasitic capacitance and the second parasitic capacitance is a constant.

The present invention provides a TFT array, which includes a substrate, a plurality of the above-mentioned TFTs and a plurality of pixel electrodes. Wherein, the substrate is partitioned into a plurality of pixel regions and each TFT is assigned to a corresponding pixel region. All pixel electrodes are disposed in each corresponding pixel region, respectively and electrically connected to a corresponding TFT. Note that the sum of the first parasitic capacitance and the second parasitic capacitance in each pixel region is a constant in each pixel region.

In an embodiment of the present invention, the total area of the first overlapping region and the second overlapping region in each TFT is a constant.

In an embodiment of the present invention, both the control part and the capacitance compensation part of the above-described gate are bar-shaped, and the bar-shaped control part and the bar-shaped capacitance compensation part are parallel.

In an embodiment of the present invention, the above-described source further has an extending part, which overlaps with the capacitance compensation part.

In an embodiment of the present invention, the above-mentioned channel, for example, bends from above the control part of the gate towards above the connection part of the gate.

In an embodiment of the present invention, the above-mentioned semiconductor layer resides, for example, over the control part and the capacitance compensation part of the gate.

The present invention further provides a method for repairing TFT arrays, suitable for repairing the above-described TFT array. According to the repairing method, as an electrostatic damage between the capacitance compensation part of the gate and the drain or the extending part of the source in the above-described TFT occurs, the capacitance compensation part and the control part are electrically insulated first, then the capacitance compensation part and the drain or the extending part of the source are fused.

In an embodiment of the present invention, the above-mentioned connection part of the gate is cut off, for example, in a laser cutting process.

In an embodiment of the present invention, the above-mentioned capacitance compensation part and the drain or the extending part of the source are fused, for example, in a laser fusing process.

The present invention provides a TFT having a gate with special design, which can avoid poor display quality encountered in the prior art caused by the exposure process error during TFT array process.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
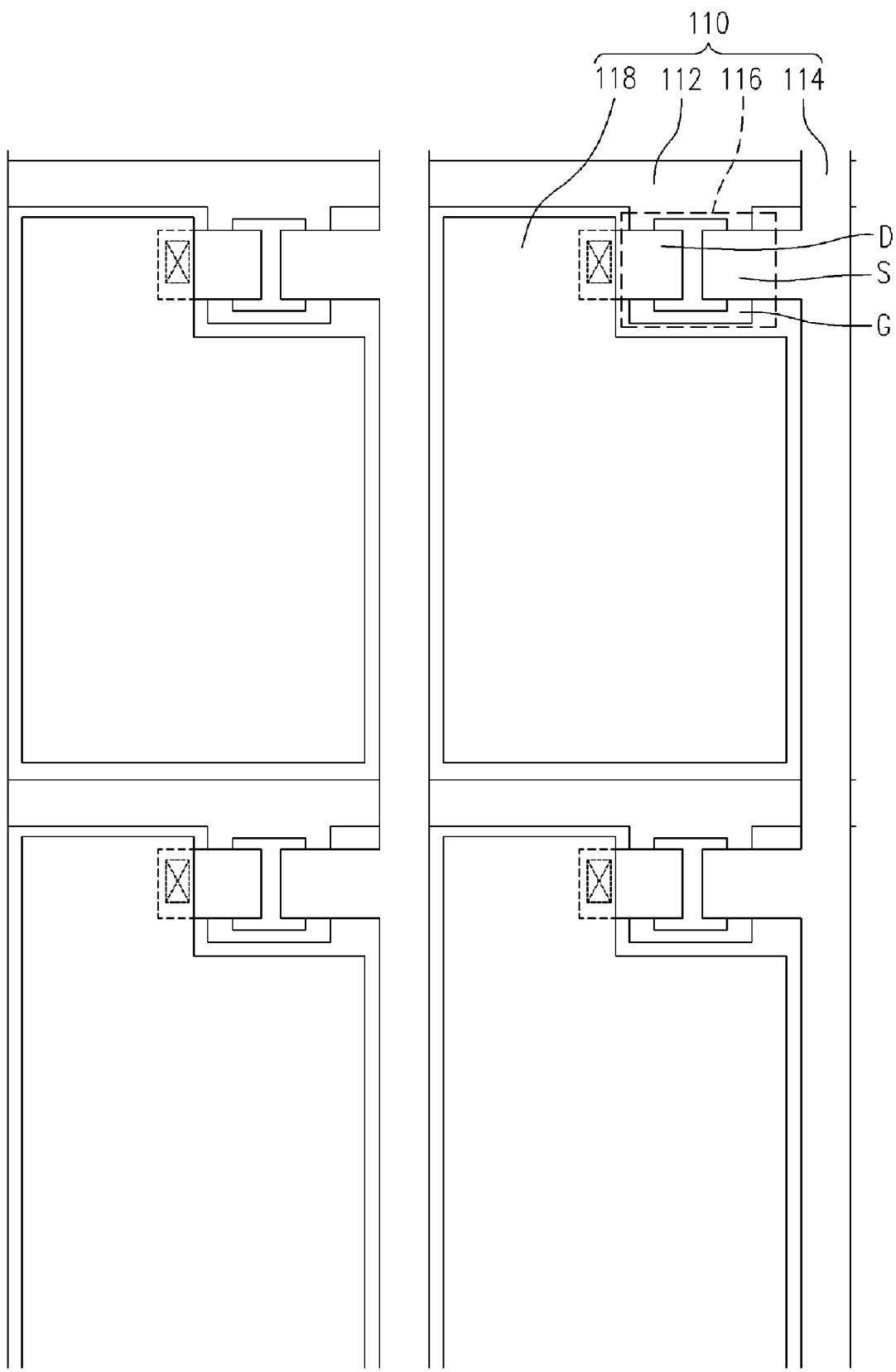
FIG. 1 is a top view of a conventional thin film transistor array (TFT array).
Figure 2:
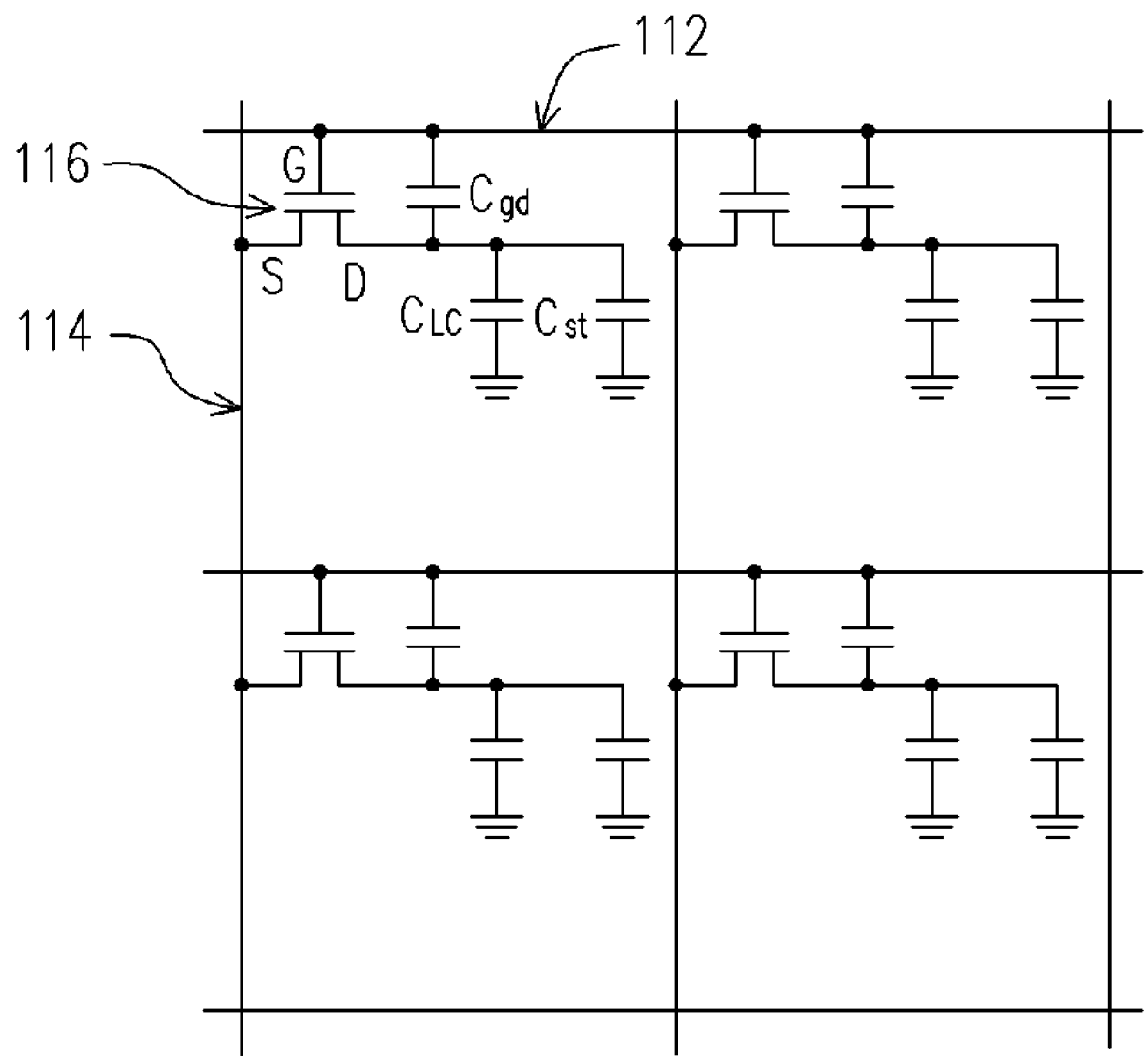
FIG. 2 is a schematic equivalent circuit drawing of a single pixel in a conventional TFT LCD.
Figure 3:
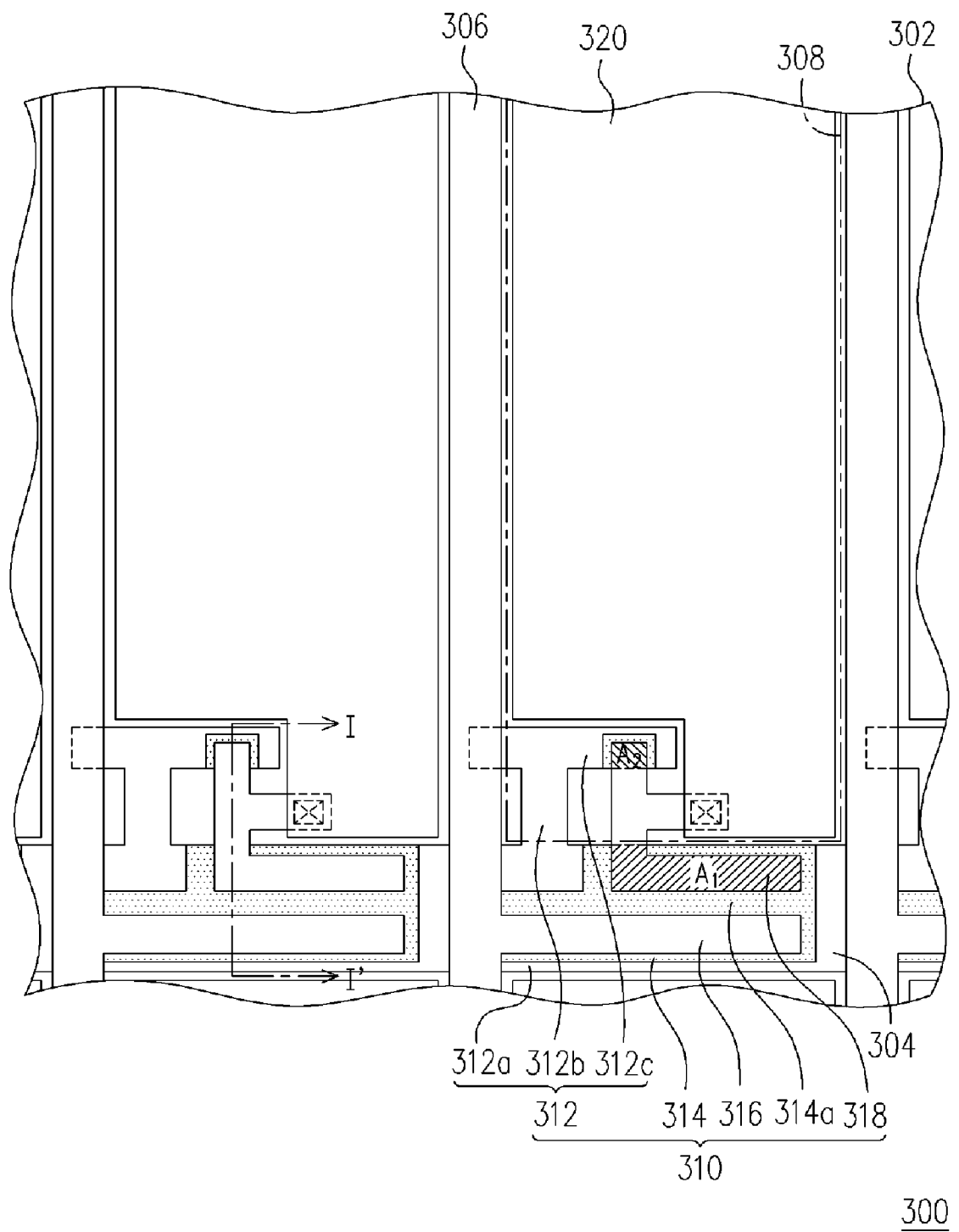
FIG. 3 is a partial top view of a TFT array in the first embodiment of the present invention.
Figure 4:
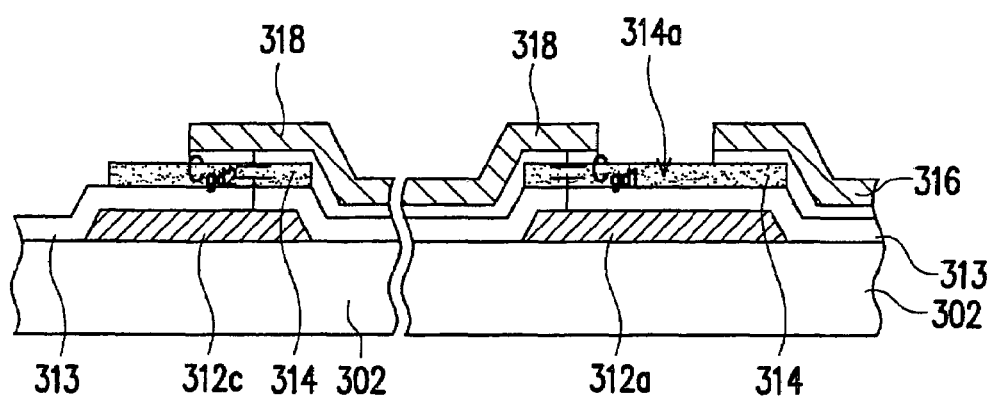
FIG. 4 is a cross-sectional view along plane I-I' of the TFT array in FIG. 3.

FIG. 3 is partial top view of a TFT array in the first embodiment of the present invention. FIG. 4 is a cross-sectional view along plane I-I' of the TFT array in FIG. 3. Referring to FIG. 3, a TFT array 300 mainly includes a substrate 302, a plurality of TFTs 310 and a plurality of pixel electrodes 320. Wherein, scan lines 304 and data lines 306 are disposed on the substrate 302 and the substrate 302 is partitioned into a plurality of pixel regions by the scan lines 304 and data lines 306. One TFT 310 and one pixel electrode 320 are disposed in each of the pixel regions. The structure of the TFT 310 is described hereinafter in more details.

Referring to FIGS. 3 and 4, a TFT 310 mainly includes a gate 312, a semiconductor layer 314, a source 316 and a drain 318. The gate 312 is disposed on the substrate 302 and electrically connected to the scan line 304. In particular, the gate 312 has a control part 312a, a connection part 312b and a capacitance compensation part 312c, wherein the connection part 312b resides between the control part 312a and the capacitance compensation part 312c and joins the two parts 312a and 312c together. In the embodiment, the control part 312a and the capacitance compensation part 312c of the gate 312 are, for example, bar-shaped and the two parts 312a and 312c are parallel.

Note that the gate 312 and the scan line 304 are fabricated in a same process, which suggests a part of the scan line 304 can be directly used as the control part 312a of the gate 312. However, anyone skilled in the art knows the control part 312a of the gate 312 can be formed by an extra structure extending from the scan line 304, therefore, the present invention doesn't limit the configuration of the control part 312a to the above-described design in the embodiment.

Furthermore, the semiconductor layer 314 is disposed over the gate 312. In the embodiment, the semiconductor layer 314 is, for example, disposed over the control part 312a and the capacitance compensation part 312c of the gate 312. A further structure to be reminded is a gate insulation layer 313 disposed between the gate 312 and the semiconductor layer 314, and the purpose to dispose the gate insulation layer 313 is manifest without explanation for those skilled in the art.

The source 316 and the drain 318 are disposed on a part of the semiconductor layer 314. The source 316 is electrically connected to the data line 306, the drain 318 is electrically connected to the pixel electrode 320 and the semiconductor layer 314 between the source 316 and the drain 318 is used as the channel 314a of the TFT 310.

Note that the source 316 of the TFT 310 has, for example, an extending part, which is overlapped with a part of the capacitance compensation part 312c. The extending part of the source 316 in the TFT array 300 is formed by a part of the data line 306. In other words, in the embodiment, the data line 306 overlaps with a part of the capacitance compensation part 312c.

Note that between one end of the drain 318 and the control part 312a of the gate 312, there is a first overlapping region $A_1$, which makes the drain 318 and the control part 312a form a first parasitic capacitance $C_{gd1}$. While between another end of the drain 318 and the capacitance compensation part 312c of the gate 312, there is a second overlapping region $A_2$, which makes the drain 318 and the capacitance compensation part 312c form a second parasitic capacitance $C_{gd2}$. Furthermore, the sum of the first parasitic capacitance $C_{gd1}$ and the second parasitic capacitance $C_{gd2}$ is a constant. That is to say, in each of the pixel regions of the TFT array 300, the sum of the first parasitic capacitance $C_{gd1}$ and the second parasitic capacitance $C_{gd2}$ is a constant.

In general, the film thickness between the drain 318 and the capacitance compensation part 312c of the gate 312 is equal to the film thickness between the drain 318 and the control part 312a of the gate 312. Under the condition, the sum of the first parasitic capacitance $C_{gd1}$ and the second parasitic capacitance $C_{gd2}$ depend on the area of the first overlapping region $A_1$ and the area of the second overlapping region $A_2$, respectively. In the following, how the sum of the parasitic capacitances of each pixel region 308 in the above-described TFT array keeps a constant is explained.

Referring to FIG. 3 again, in an exposure process for forming the drain 318 and the source 319, when an alignment error of a mask occurs, and an unwanted displacement of the drain 318 at the extending direction of the data line 306 is generated, leading to a smaller area of the first overlapping region $A_1$ than a preset value, the area of the second overlapping region $A_2$ is bigger than a preset value, and the increased area of the second overlapping region $A_2$ is equal to the decreased area of the first overlapping region $A_1$.

In the same way, if an alignment error of a mask occurs, leading to a bigger first overlapping region $A_1$ than a preset value, the area of the second overlapping region $A_2$ should be smaller than a preset value. It can be seen herefrom that although the first overlapping region $A_1$ and the second overlapping region $A_2$ in each pixel region have unequal areas due to a process error, the total area of the first overlapping region $A_1$ and the second overlapping region $A_2$ keeps a constant. Thus, the sum of the first parasitic capacitance $C_{gd1}$ and the second parasitic capacitance $C_{gd2}$ in each pixel region 308 also keeps a constant, which makes the feed-through voltages $\Delta V_p$ in all pixel regions almost identical and accordingly significantly improves the even brightness of the display panel formed by the TFT array 300 in the present invention.

Figure 5:
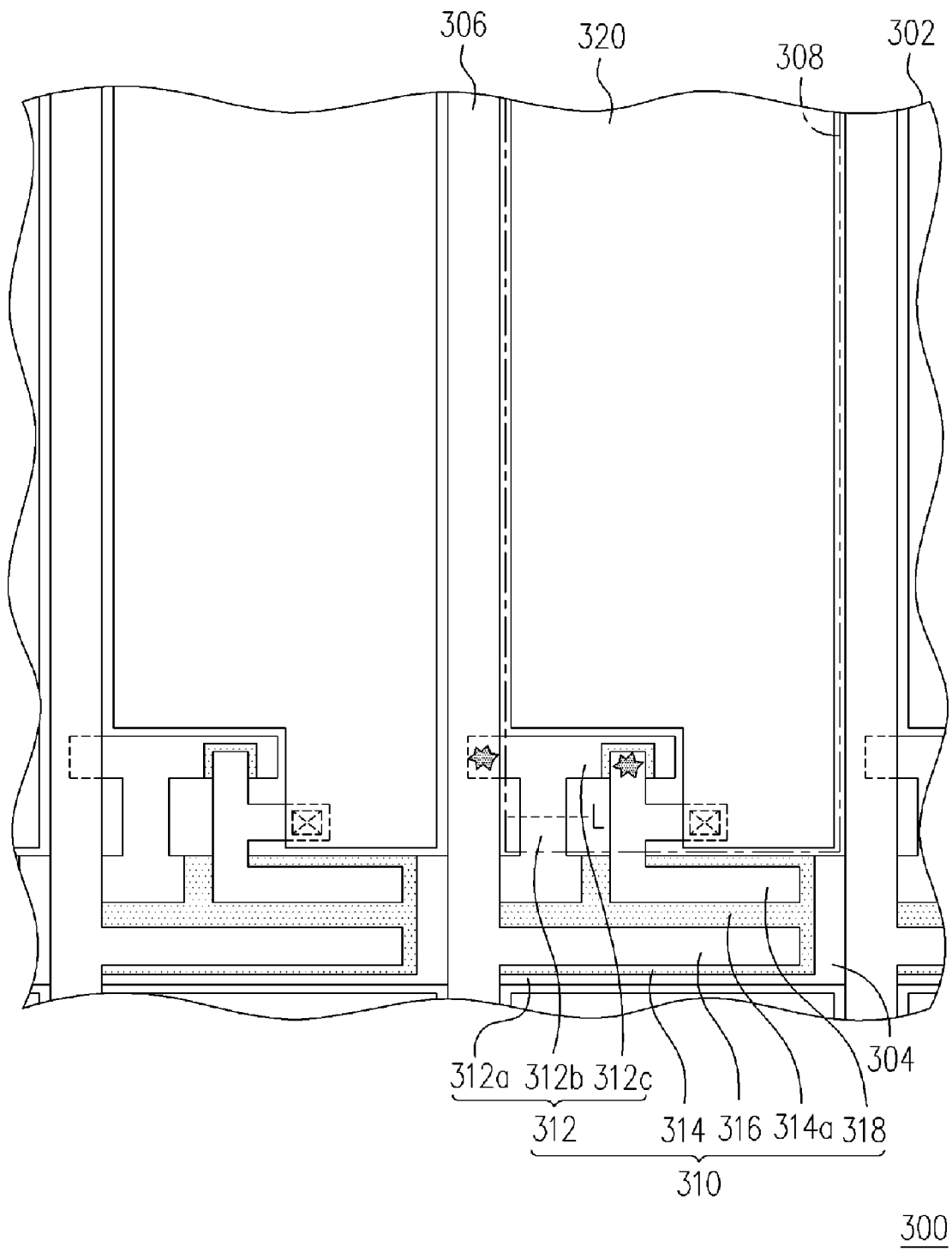
FIG. 5 is a diagram showing how to repair a TFT array getting electrostatic damage.

FIG. 5 is a diagram showing how to repair a TFT array getting electrostatic damage. Referring to FIG. 5, as the TFT array 300 operated at exceptional state, mura consequently appear in the frames. In repair, the connection part 312b of the gate 312 is cut along a cutoff line L, then the two overlapping portions between the drain 318 and the capacitance compensation part 312c and between the data line 306 and the capacitance compensation part 312c are fused, such that the voltage applying to the pixel electrode 320 is coupled to the signal of the data line 306 and the mura is eliminated. Wherein, the connection part 312b is cut off, for example, in a laser cutting process in the embodiment, and the two overlapping portions between the drain 318 and the capacitance compensation part 312c and between the data line 306 and the capacitance compensation part 312c are fused, for example, in a laser fusing process in the embodiment.

Figure 6:
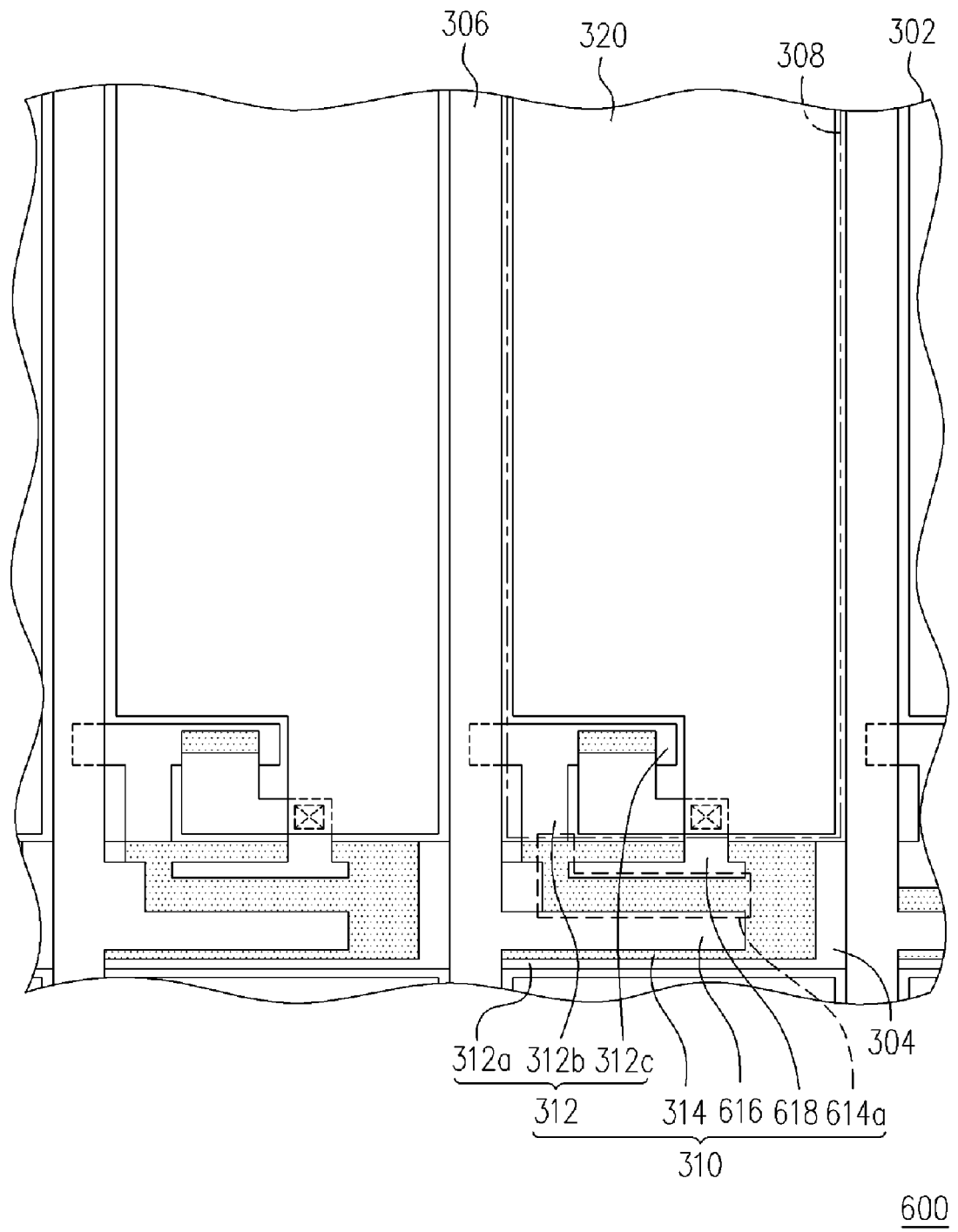
FIG. 6 is a partial top view of a TFT array in the second embodiment of the present invention.

FIG. 6 is a partial top view of a TFT array in the second embodiment of the present invention. Referring to FIG. 6, a TFT array 600 mainly includes a substrate 302, a plurality of TFTs 610 and a plurality of pixel electrodes 320, wherein the TFT array 600 is almost similar to the TFT array 300 in the first embodiment, therefore all the same components in FIG. 6 as in FIG. 3 are indicated with the same numbers. The differences of the TFT array 600 from the TFT array 300 are explained hereinafter.

In the embodiment, the channel between the source 616 and the drain 618 of the TFT 610, for example, bends from above the control part 312a of the gate 312 towards above the connection part 312a of the gate 312. Therefore, the channel 614a in the embodiment is quasi L-shaped. With a quasi L-shaped channel, if the channel width thereof is the same as the straight channel in the prior art, obviously the drain 618 of the embodiment can be made shorter, which would further reduce the parasitic capacitance between the drain 618 and the gate 312.

In addition, if the above-described quasi L-shaped channel 614a is adopted in a conventional TFT array, as an end of the channel 614a is adjacent to an edge of the control part 312a of the gate 312 and is thus prone to be irradiated by a backlight source of the display, leading to a photo-induced leakage current in the channel 614a. On the contrary, in the TFT array 600 of the present invention, despite the fact that an end of the channel 614a is adjacent to the edge of control part 312a of the gate 312, the connection part 312b joined by the control part 312a is able to block the incident light from the backlight source, which prevents the incident light from irradiating the channel 614a and the photo-induced leakage current in the channel 614a is accordingly avoided.

In summary, the present invention has at least the following features and advantages:

1. In the TFT array of the present invention, since the sum of the first parasitic capacitance and the second parasitic capacitance in each pixel region is the same, the feed-through voltages in all pixel regions are expected to be identical. In this way, the display formed by the TFT array of the present invention can have good display quality.

2. A simple repairing method provided by the present invention is able to avoid the display malfunction of an individual pixel in the TFT array, which can reduce bright spots.

3. The quasi L-shaped channel of the present invention can widen the channel without increasing the parasitic capacitance between gate and drain, so that the drain current of a TFT can be increased. Moreover, the connection part and the capacitance compensation part of the gate in the present invention can be used to block the incident light from a backlight source of a display to irradiate on the channel, thus avoiding photo-induced leakage current in the channel.

4. To fabricate a TFT of the present invention, the conventional five photo-mask processes can still be used. That is to say, no additional exposure process is required, which means no additional production cost.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A thin film transistor (TFT) comprising:
   a gate, disposed on a substrate and having a control part, a connection part and a capacitance compensation part, wherein the connection part joins the control part and the capacitance compensation part;
   a semiconductor layer, disposed over the gate;
   a source, disposed on a part of the semiconductor layer; and
   a drain, disposed on a part of the semiconductor layer, wherein a channel is formed between the source and the drain in the semiconductor layer, a first overlapping region between an end of the drain and the control part of the gate and the first overlapping region induces a first parasitic capacitance, a second overlapping region between another end of the drain and the capacitance compensation part of the gate and the second overlapping region induces a second parasitic capacitance, wherein the sum of the first parasitic capacitance and the second parasitic capacitance is a constant.

2. The TFT as recited in claim 1, wherein the sum of the first overlapping region area and the second overlapping region area is a constant.

3. The TFT as recited in claim 1, wherein the control part and the capacitance compensation part of the gate are bar-shaped, respectively.

4. The TFT as recited in claim 3, wherein the control part and the capacitance compensation part of the gate are parallel.

5. The TFT as recited in claim 1, wherein the source further has an extending part and the extending part overlaps with a part of the capacitance compensation part.

6. The TFT as recited in claim 1, wherein the channel extends from above the control part of the gate towards above the connection part of the gate.

7. The TFT as recited in claim 1, wherein the semiconductor layer resides over the control part and the capacitance compensation part of the gate.

8. A thin film transistor array (TFT array), comprising:
   a substrate, having a plurality of pixel regions;

a plurality of TFTs, disposed in each corresponding pixel region, respectively, the TFTs comprising:

a gate, disposed on the substrate and having a control part, a connection part and a capacitance compensation part, wherein the connection part joins the control part and the capacitance compensation part;

a semiconductor layer, disposed over the gate;

a source, disposed on a part of the semiconductor layer; and a drain, disposed on a part of the semiconductor layer, wherein a channel is formed between the source and the drain in the semiconductor layer, a first overlapping region between an end of the drain and the control part of the gate and the first overlapping region induces a first parasitic capacitance, a second overlapping region between another end of the drain and the capacitance compensation part of the gate and the second overlapping region induces a second parasitic capacitance, wherein the sum of the first parasitic capacitance and the second parasitic capacitance in each pixel region is a constant; and a plurality of pixel electrodes, disposed in each corresponding pixel region, respectively and electrically connected to the corresponding TFT, respectively.

9. The TFT array as recited in claim 8, wherein in each pixel region, the sum of the first overlapping region area and the second overlapping region area is a constant.

10. The TFT array as recited in claim 8, wherein the control part and the capacitance compensation part of the gate are bar-shaped, respectively.

11. The TFT array as recited in claim 10, wherein the control part and the capacitance compensation part of the gate are parallel.

12. The TFT array as recited in claim 8, wherein the source in each pixel region further has an extending part and the extending part overlaps with a part of the capacitance compensation part.

13. The TFT array as recited in claim 8, wherein the channel extends from above the control part of the gate towards above the connection part of the gate.

14. The TFT array as recited in claim 8, wherein the semiconductor layer resides over the control part and the capacitance compensation part of the gate.

15. A repairing method of a thin film transistor array (TFT array), suitable for repairing the TFT array as recited in claim 12 when an electrostatic damage occurs between the capacitance compensation part of one of the gates and the extending part of the source or the drain, the repair method comprising:

cutting off the connection part of the gate, so that the capacitance compensation part of the gate and the connection part of the gate are electrically insulated from each other; and fusing the capacitance compensation part and the drain or the extending part of the source.

16. The repair method of a TFT array as recited in claim 15, wherein the method for cutting off the connection part of the gate comprises a laser cutting process.

17. The repair method of a TFT array as recited in claim 15, wherein the method for fusing the capacitance compensation part and the drain or the extending part of the source comprises a laser fusing process.

* * * * *